United States Patent
Pichard et al.

(10) Patent No.: US 7,295,643 B2
(45) Date of Patent: Nov. 13, 2007

(54) METHOD AND A DEVICE FOR PHASE AND FREQUENCY COMPARISON

(75) Inventors: Fabrice Pichard, Saint Manvieu (FR); David Canard, Caen (FR)

(73) Assignee: Stepmind, Bologne Billancourt (FR)

( * ) Notice: Subject to any disclaimer, the term of this patent is extended or adjusted under 35 U.S.C. 154(b) by 539 days.

(21) Appl. No.: 10/495,997

(22) PCT Filed: Nov. 7, 2002

(86) PCT No.: PCT/FR02/03823

§ 371 (c)(1),
(2), (4) Date: May 18, 2004

(87) PCT Pub. No.: WO03/044960

PCT Pub. Date: May 30, 2003

(65) Prior Publication Data

US 2004/0258186 A1    Dec. 23, 2004

(30) Foreign Application Priority Data

Nov. 19, 2001 (FR) .................................. 01 14946

(51) Int. Cl.
*H03D 3/24* (2006.01)
(52) U.S. Cl. ...................................... 375/375; 375/376
(58) Field of Classification Search ........ 375/371–376, 375/354, 362; 327/147–163, 141; 455/260; 331/1 R
See application file for complete search history.

(56) References Cited

U.S. PATENT DOCUMENTS 4,964,117 A * 10/1990 Shier ......................... 375/357

(Continued)

FOREIGN PATENT DOCUMENTS

EP    0316543 A    5/1989

(Continued)

OTHER PUBLICATIONS

Larsson, P. "Reduced Pull-in Time Of Phase-locked Loops Using A Simple Nonlinearphase Detector" IEE Proceedings: Communications, Institution Of Electrical Engineers, GB, vol. 142, No. 4, Aug. 1, 1995 pp. 221-226.

*Primary Examiner*—Mohammed Ghayour
*Assistant Examiner*—Vineeta Panwalkar
(74) *Attorney, Agent, or Firm*—Harness, Dickey & Pierce, PLC (57) ABSTRACT

The phase and frequency comparator for controlling, as a function of the frequency ($F_{ref}$) and the phase of a reference signal ($S_{ref}$), the frequency ($F_{vco}$) and the phase of the output signal of a controlled-frequency oscillator comprises means (11, 12, 21, 22) for detecting in the reference signal ($S_{ref}$) and in the signal from the oscillator events representative of the frequency and the phase of that signal, means ($S1^+$, S1, 16, 17) for generating a first or second signal on the detection of an event, means ($S2^+$, $S2_-$, 24 to 27) for generating a third or fourth signal on the detection of an event, if the first or second signal, respectively, is generated, means for applying all of the signals ($I_o$; $V_o$) generated to the oscillator, and means (13, 23) for halting the generation of the first and second signals or of all of the signals if the first and second signals or the third and fourth signals, respectively, are generated simultaneously.

14 Claims, 6 Drawing Sheets

U.S. PATENT DOCUMENTS

| | | | | |
|---|---|---|---|---|
| 5,459,765 A | * | 10/1995 | Meyer et al. | 375/360 |
| 5,828,253 A | * | 10/1998 | Murayama | 327/156 |
| 5,909,130 A | * | 6/1999 | Martin et al. | 327/12 |
| 6,496,554 B1 | * | 12/2002 | Ahn | 375/376 |
| 6,605,935 B2 | * | 8/2003 | Nilsson | 324/76.53 |
| 6,791,381 B2 | * | 9/2004 | Stubbs et al. | 327/156 |
| 7,003,065 B2 | * | 2/2006 | Homol et al. | 375/376 |
| 2002/0126787 A1 | * | 9/2002 | Homol et al. | 375/376 |
| 2002/0163325 A1 | * | 11/2002 | Nilsson | 324/76.53 |
| 2003/0038619 A1 | * | 2/2003 | Boateng | 324/76.53 |
| 2003/0048139 A1 | * | 3/2003 | Chien et al. | 331/11 |

FOREIGN PATENT DOCUMENTS

| | | |
|---|---|---|
| EP | 0369858 A | 5/1990 |
| FR | 2598869 A | 11/1987 |

* cited by examiner

Prior Art

Fig. 5

Prior Art

Fig. 6

Prior Art

METHOD AND A DEVICE FOR PHASE AND FREQUENCY COMPARISON

FIELD

The present invention relates to a method and a device for phase and frequency comparison.

This kind of device is used in a phase-locked loop (PLL) for controlling a voltage-controlled oscillator (VCO), for example.

BACKGROUND

A phase-locked loop conventionally comprises a voltage-controlled oscillator whose output is looped to the input of a phase comparator via a frequency divider, the phase comparator being connected to a reference frequency source and comparing the phase of the signal from the oscillator with the phase of a reference signal. The output signal of the phase comparator is applied to a control input of the oscillator via a low-pass filter.

The present invention applies particularly, although not exclusively, to mobile telephony, in which a geographical coverage area is divided into radio cells each of which is assigned a respective transmission channel. In this context, the transmit and receive circuits of mobile telephones include a voltage-controlled oscillator integrated into a phase-locked loop of the type described above, with the output of the oscillator fed to the input of the phase comparator via a frequency divider that divides by a division ratio N. The function of the phase-locked loop is to lock the output frequency of the oscillator to a frequency of the channel of the cell in which the mobile telephone is located, each channel corresponding to a respective value of the ratio N. Furthermore, to be able to determine whether the mobile telephone has changed cell or not, it is necessary to scan the channels of adjacent cells periodically and to compare the strengths of signals received from those cells with signals received from the current cell. To effect this scanning, the value of the division ratio N is modified to lock the oscillator onto the frequency of the channel of the adjacent cell. Once a signal has been received on that channel, the value of the ratio N is modified again to lock the oscillator onto the preceding frequency corresponding to the channel of the current cell.

Unfortunately, the time needed to lock the oscillator to the frequency of a channel is not negligible, and reduces commensurately the time available in which payload information can be transmitted, and thus the payload bandwidth. It is therefore clear that the shorter the oscillator acquisition and locking time, the greater the bandwidth available for transmitting information.

SUMMARY

The present invention is directed to a phase comparator or a phase and frequency detector that reduces the acquisition and locking time of an oscillator in a phase-locked loop compared to prior art devices.

The above objective is achieved by providing a method for controlling, as a function of frequency and phase of a reference signal, the frequency and the phase of an output signal of an oscillator having a frequency control input, said method comprising the steps of:

detecting continuously in the reference signal and in the signal from the oscillator events representative of the frequency and the phase of that signal, generating a first control signal at a first level after detecting one of said events in a first signal of said reference signal and said signal from the oscillator, generating a second control signal at the first level and of opposite polarity to the first control signal after detecting one of said events in a second signal of said reference signal and said signal from the oscillator, applying the control signal thus generated to the control input of the oscillator, and halting generation of the first and second control signals if they are generated simultaneously, which method is characterized in that it further comprises the steps of:

if the first control signal is generated, triggering the generation of a third control signal at a second level after detecting one of said events in the second signal of said reference signal and said signal from the oscillator, if the second control signal is generated, triggering the generation of a fourth control signal at the second level and of the opposite polarity to the third control signal after detecting one of said events in the second signal of said reference signal and said signal from the oscillator, determining the control signal to be applied to the control input of the oscillator by adding all of the control signals thus generated, and halting generation of all the control signals if the third and fourth control signals are generated simultaneously.

Preferably, the frequency of the output signal of the oscillator is divided by a division ratio, and events in the signal from the oscillator are detected in the signal whose frequency has been divided by the division ratio.

The second control signal level is preferably identical to the first control signal level.

Alternatively, the second control signal level is slightly higher than the first control signal level.

According to a feature of the invention, the method further comprises the steps of:

generating a $(2i-1)^{th}$ control signal at an $i^{th}$ level after detecting one of said events in the first signal of said reference signal and said signal from the oscillator while the $(2i-3)^{th}$ control signal is generated, where i is an integer greater than 2, generating a $(2i)^{th}$ control signal at the $i^{th}$ level and of the opposite polarity to the $(2i-1)$th control signal after detecting one of said events in the first signal of said reference signal and said signal from the oscillator while the $(2i-2)^{th}$ control signal is generated, and halting the generation of the $(2i)^{th}$, $(2i-1)^{th}$, $(2i-2)^{th}$ and $(2i-3)^{th}$ control signals if the $(2i)^{th}$, $(2i-1)^{th}$ control signals are generated simultaneously.

The $i^{th}$ control signal level is advantageously identical to the $(i-1)^{th}$ control signal level.

The invention also provides a phase and frequency comparator adapted to control the frequency of an output signal of an oscillator having a frequency control input, the comparator receiving as input a signal having a reference frequency and a signal from the oscillator and comprising:

first detection means for detecting continuously in the reference signal and in the signal from the oscillator events representative of the frequency and the phase of that signal, a first source of control signals at a first level, a second source of control signals at the first level and of the opposite polarity to the signal from the first source, first switching means which when closed apply to the output of the comparator the control signal from the first source after detection of one of said events in a first signal of said reference signal and said signal from the oscillator, second switching means which when closed apply to the output of the comparator the signal from the second source after detection of one of said events in the second signal of said reference signal and said signal from the oscillator, and first control means for controlling the first and second switching means to place them in the open state when they are simultaneously in the closed state, which phase comparator is characterized in that it further comprises:

a third source of control signals at a second level, a fourth source of control signals at the second level and of the opposite polarity to the signal from the third source, third switching means which, in the closed state when the first switching means are in the closed state, apply to the output of the comparator the control signal from the third source after detection of one of said events in the first signal of said reference signal and said signal from the oscillator, fourth switching means which, in the closed state when the second switching means are in the closed state, apply to the output of the comparator the signal from the fourth source after detection of one of said events in the second signal of said reference signal and said signal from the oscillator, the output signal of the comparator having a level corresponding to the sum of the control signals applied by the switching means at the output of the comparator, and second control means adapted to place the first and second switching means in the open state when the third and fourth switching means are simultaneously in the closed state.

The first and second control signal levels are advantageously constant.

According to another feature of the invention, the phase and frequency comparator further comprises second detector means for continuously detecting in the reference signal and in the signal from the oscillator events representative of the frequency and the phase of that signal and means for activating the second detection means only if the first or the second switching means are in the closed state and for maintaining the second detection means in the closed state independently of the state of the first detection means.

The phase and frequency comparator advantageously further comprises means for maintaining the second detection means active during the change to the open state of the first and second switching means.

According to another feature of the invention, the phase and frequency comparator further comprises means for maintaining the first control means and the second control means in the active state until the first switching means and the second switching means and/or the third switching means and the fourth switching means have changed to the open state after triggering of the control means.

According to a further feature of the invention, the phase and frequency comparator further comprises:

a $(2i-1)^{th}$ source of control signals at an $i^{th}$ level, a $(2i)^{th}$ source of control signals at the $i^{th}$ level and of the opposite polarity to the signal from the $(2i-1)^{th}$ source, $(2i-1)^{th}$ switching means which, in the closed state when the $(2i-3)^{th}$ switching means are in the closed state, apply to the output of the comparator the control signal from the $(2i-1)^{th}$ source after detection of one of said events in the first signal of said reference signal and said signal from the oscillator, $(2i)^{th}$ switching means which, in the closed state when the $(2i-2)^{th}$ switching means are in the closed state, apply to the output of the comparator the signal from the $(2i)^{th}$ source, after detection of one of said events in the second signal of said reference signal and said signal from the oscillator, the output signal of the comparator having a level corresponding to the sum of the control signals applied by the switching means to the output of the comparator, and means for controlling the $(2i-3)^{th}$ to $(2i)^{th}$ switching means to place them in the open state when the $(2i-1)^{th}$ and $(2i)^{th}$ switching means are simultaneously in the closed state.

DRAWINGS

A preferred embodiment of the invention is described below by way of non-limiting example and with reference to the appended drawings, in which.

DETAILED DESCRIPTION

Figure 1:
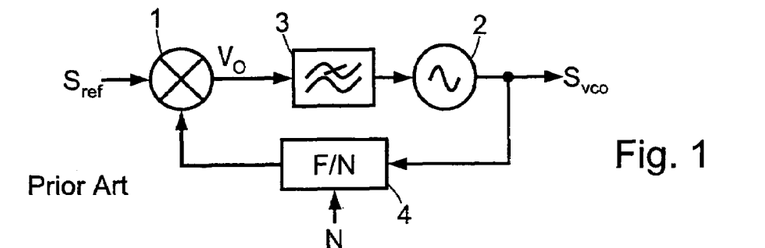
FIG. 1 is a diagram depicting a conventional phase-locked loop.

FIG. 1 depicts a phase-locked loop widely used in the transceiver circuits of mobile telephones.

This kind of loop comprises a phase and frequency comparator 1 to which is applied a signal $S_{ref}$ obtained from a quartz crystal oscillator, for example, and having a constant reference frequency $F_{ref}$. The output signal of the comparator 1 is filtered by a low-pass filter 3 and is then applied to the control input of a voltage-controlled oscillator (VCO) 2 that delivers a signal $S_{vco}$ whose frequency $F_{vco}$ can be increased or reduced as a function of a positive or negative voltage applied to its control input. To slave the frequency $F_{vco}$ to the reference frequency $F_{ref}$, the signal $S_{vco}$ is applied to another input of the phase and frequency comparator 1, which supplies a signal proportional to the measured phase difference between the two signals applied to its inputs.

To be able to vary the frequency $F_{vco}$ of the output signal, the output of the oscillator 2 is connected to the input of the comparator 1 via a frequency divider 4 that divides by a variable integer or non-integer ratio N. In this case, the reference frequency $F_{ref}$ is made equal to the step by which the required output frequency is varied.

Figure 2:
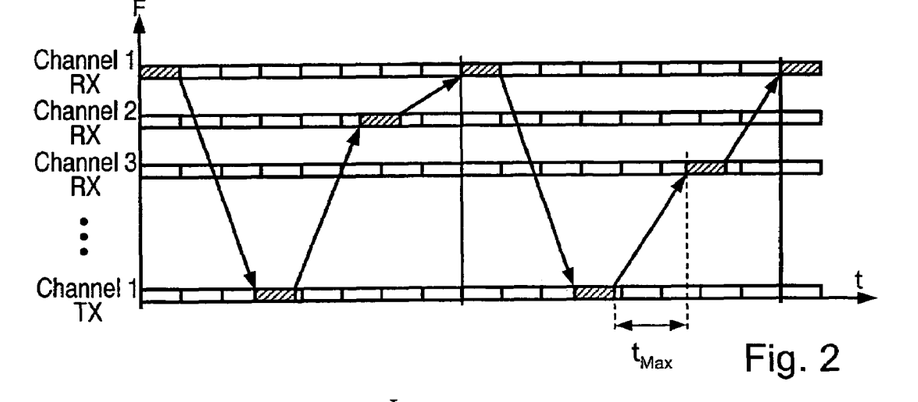
FIG. 2 is a timing diagram depicting a sequence of transmission and reception by a mobile telephone.

This kind of phase-locked loop is used in mobile telephony, for example. In a mobile telephone system, the band of frequencies assigned to the system is divided into channels and the geographical area covered by the system is divided into cells, each cell having at least one transmit channel and one receive channel and comprising at least one base station through which mobile telephones in the cell communicate with the network. Each mobile telephone that is connected to the network is assigned a time slot in a periodic transmit and receive frame. FIG. 2 depicts, in the form of a graph of frequency as a function of time, two frames made up of time slots transmitted on different channels. In this graph, the shaded areas represent periods during which a particular mobile telephone is actively transmitting or receiving. In the example depicted in this figure, the mobile telephone uses the first time slot of the receive RX channel 1 and the fourth time slot of the transmit TX channel 1. On each change between transmit and receive mode, the local oscillator of the mobile telephone must be locked to the frequency of the corresponding channel. Likewise, to be able to determine if the mobile telephone must change cell as a function of its position relative to the base stations, it must scan the receive channels of the adjacent cells, i.e. the RX channel 2 and the RX channel 3 in the FIG. 2 example. To this end, the local oscillator must be commanded to lock onto the frequency of those two channels. Accordingly, during a frame, the mobile telephone effects a receive sequence on one channel, a transmit sequence on a second channel, and a scanning sequence on a third channel. Thus three changes of frequency (indicated by the arrows in the figure) must be effected in each frame. It should be noted that transmission is effected slightly in advance of the fourth time slot so that the base station actually receives the data to be sent during that time slot.

It is therefore apparent that the sum of the time periods during which the telephone is actively transmitting and receiving (the shaded areas) and the times needed to effect these frequency changes must be less than the duration of a frame.

Consequently, to avoid affecting the payload transmission bit rate, these frequency changes must be effected rapidly, which implies that the phase-locked loop must rapidly lock the oscillator onto the frequency of the required channel after the division ratio N is changed.

Moreover, the time needed to effect these frequency changes must be short if the payload bandwidth of the mobile telephone system is to be increased.

Figure 3:
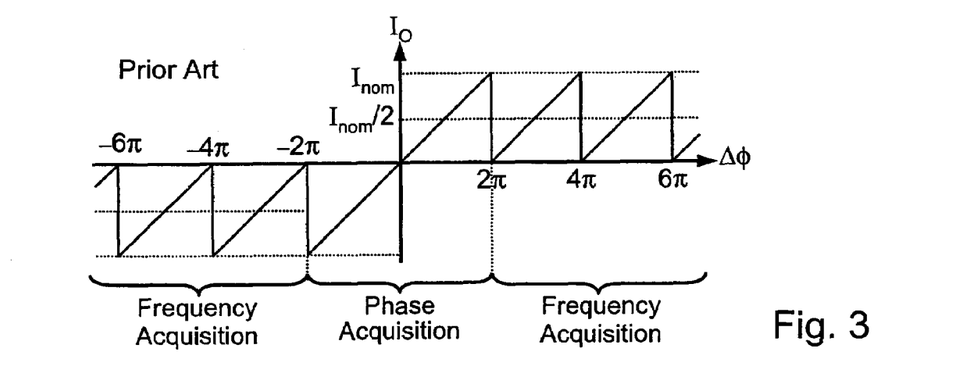
FIG. 3 depicts a transfer function of a prior art phase and frequency comparator, in the form of a curve of oscillator control current as a function of phase difference.

The phase and frequency comparators routinely used in this field have a transfer function like that shown in FIG. 3. This transfer function comprises three areas, namely a phase acquisition area, in which the phase difference $\Delta\phi$ measured by the comparator is from $-2\pi$ to $+2\pi$, and two frequency acquisition areas in which the phase difference is less than $-2\pi$ and greater than $2\pi$, respectively. Moreover, in each slot from $2n\pi$ to $2(n+1)\pi$, where n is a positive or negative integer or zero, the output current $I_o$ of the comparator is proportional to the phase difference $\Delta\phi$ measured by the comparator. In particular, this linear variation of the current $I_o$ as a function of the phase difference applies throughout the phase acquisition area.

Figure 4:
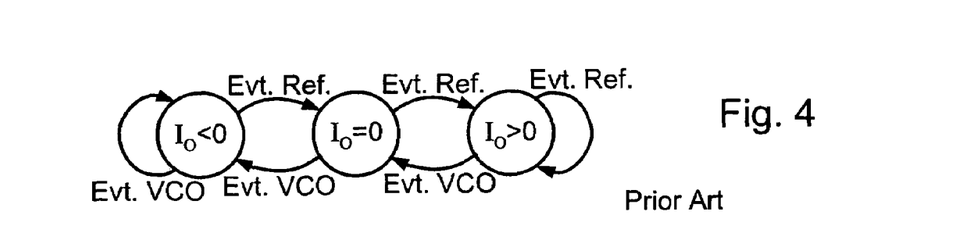
FIG. 4 depicts an automaton providing the FIG. 3 transfer function, in the form of a state and transition diagram.

The above transfer function can be obtained with the aid of an automaton like that shown in FIG. 4, which has three states, namely a state corresponding to a zero control current Io and in which the oscillator 2 is locked to the set point frequency equal to N times the reference frequency $F_{ref}$, a state in which the control current $I_o$ is negative, corresponding to a negative phase difference, and a state in which the control current $I_o$ is positive, corresponding to a positive phase difference. Changes of state are instigated by the detection of an event in one or the other of the signals $F_{ref}$ and $F_{vco}$ applied to the input of the comparator 1. In the case of binary signals, one such event is the detection of a rising edge in either of the input signals, for example. If an event occurs in the reference signal, there is a change of state toward the right in the figure, until the state is reached in which $I_o$ is positive. Conversely, if an event occurs in the signal from the oscillator, there is a change of state toward the left in the figure, until the state is reached in which $I_o$ is negative.

Figure 5:
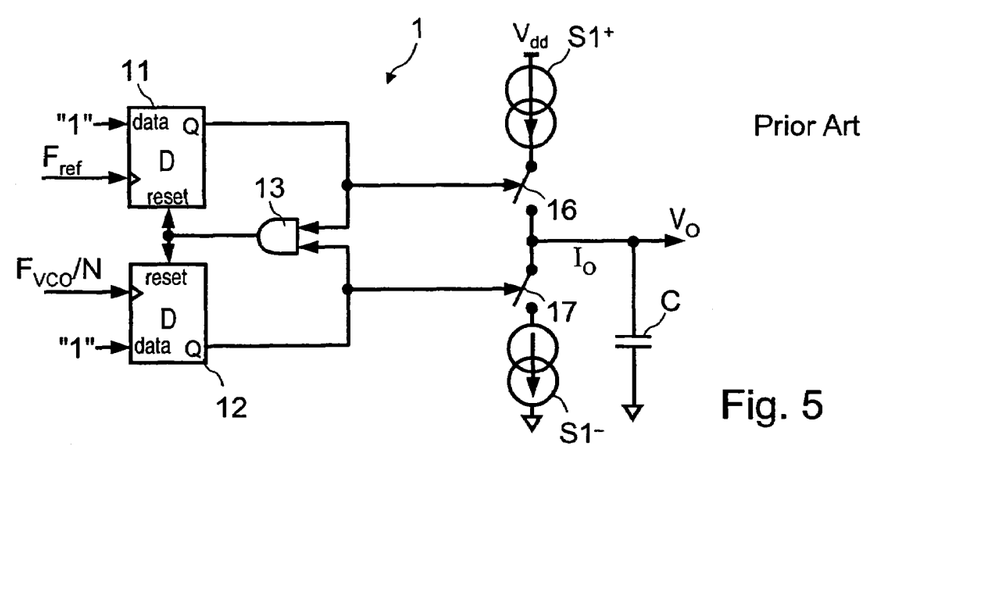
FIG. 5 is an electronic circuit diagram of a phase and frequency comparator circuit providing the transfer function depicted in FIG. 3.

The automaton can be based on the circuit depicted in FIG. 5. For more details, see the following documents:

[1] "Monolithic Phase-Locked Loops and Clock Recovery Circuits—A Tutorial", Behzad Razavi, Preface of "Monolithic Phase-Locked Loops and Clock Recovery Circuits, Theory and Design", IEEE PRESS, ISBN 0-7803-1149-3.

[2] "A 3-State Phase Detector Can Improve Your Next PLL Design", C. Andrew Sharpe, Electronic Design News Magazine, Sep. 20, 1976.

The circuit comprises two D-type bistable trigger circuits 11, 12 each having a respective clock signal input, a data input, a reset input and an output Q. When a pulse is applied to the clock signal input, this kind of bistable trigger circuit supplies at its output Q a signal identical to that at the data input. The bistable trigger circuits 11, 12 receive at their respective clock signal inputs signals at the respective frequencies $F_{ref}$ and $F_{vco}$ divided by N, the data inputs of the two bistable trigger circuits being forced to 1. The respective outputs Q of the two bistable trigger circuits 11, 12 are connected to respective inputs of an AND gate 13 whose output is connected to the reset inputs of the two bistable trigger circuits.

Moreover, the signal at the output Q of the bistable trigger circuit 11 controls a first switch 16 connected on one side to a terminal of a first current source S1* whose other terminal is connected to the $V_{dd}$ power supply rail of the circuit. The signal at the output Q of the bistable trigger circuit 12 controls a second switch 17 connected to a terminal of a second current source S1* whose other terminal is connected to ground, the two current sources supplying identical currents $I_n$ in the same direction, from the $V_{dd}$ supply rail to ground. The junction node of the two switches 16, 17 is connected to the output of the comparator 1, which supplies a current $I_o$ controlling the oscillator 2 which is equal to the difference between the currents supplied by the current sources S1* and S1* and is converted into a control voltage $V_o$ by a capacitor C connected between the junction node of the switches 16, 17 and ground. The value of the current $I_n$ is determined by the characteristics of the oscillator 2, the filter 3 and the frequency divider 4.

In the above circuit, the current sources are known as charge pumps because they charge or discharge the capacitor C.

Initially, the two bistable trigger circuits 11, 12 are in the low state. Consequently, the two switches 16, 17 are open and the control current lo is therefore zero.

If, starting from this initial state, a rising edge appears in a first of the two input signals at the respective frequencies $F_{ref}$ and $F_{vco}/N$, the corresponding bistable trigger circuit 11 or 12 goes to the high state, meaning that its output Q goes from 0 to 1. As a result, the corresponding switch 16, 17 is closed and the associated current source 16, 17 [sic] supplies a current $I_n$ that injects a positive or negative charge into the capacitor C or withdraws a positive or negative charge from it. The state is then that corresponding to a positive or negative value of $I_o$ in the FIG. 4 automaton.

If a rising edge appears in the second of the two input signals of the comparator 2, the other bistable trigger circuit 11 or 12 also goes high and supplies a signal Q that changes from 0 to 1, which closes the other switch 16, 17. As a result, the output of the AND gate 13 goes from 0 to 1, which triggers the resetting of the two bistable trigger circuits 11, 12 and thus the opening of the two switches. The output current $I_o$ then becomes zero.

It is therefore clear that locking of the oscillator 2 is achieved when rising edges of both signals reach the inputs of the bistable trigger circuits 11, 12 at the same time, causing virtually simultaneous closing and opening of the two switches 16, 17.

During frequency acquisition phases, the absolute value of the average control current is equal to $I_n/2$.

A circuit of the above kind that meets the current requirements of mobile telephone networks cannot achieve the acquisition and locking times specified in the new high bit rate mobile telephone standards, such as the Universal Mobile Telecommunication System (UMTS) standard or the International Telecommunication 2000 (IMT-2000) standard.

Figure 6:
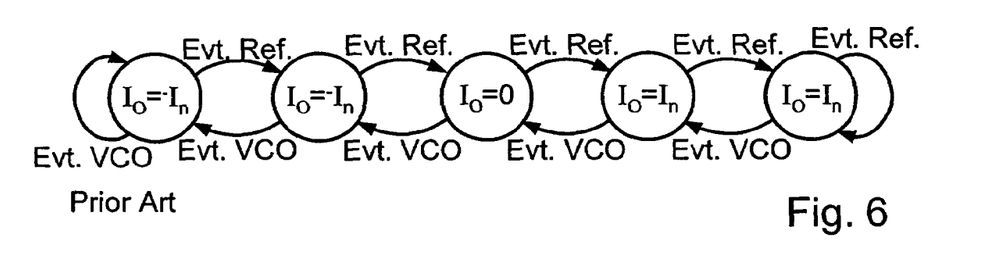
FIG. 6 depicts an automaton of another prior art phase and frequency comparator, in the form of a state and transition diagram.

There are also comparators whose operation is modeled by an automaton with five states, like that shown in FIG. 6. In FIG. 6, the automaton has five linked states forming a chain, namely a central state in which the control current $I_o$ is zero, two states to the left of the central state in which the control current $I_o$ is negative, and two states to the right of the central state in which the control current $I_o$ is positive.

In this automaton, there is a change from one state to the other and a movement from left to right each time that an event is detected in the reference signal, and a movement in the opposite direction each time that an event is detected in the signal from the oscillator 2, whose frequency has been divided by the division ratio N.

The automaton takes account of the occurrence of at least two events in one of the two input signals between two consecutive events detected in the other input signal (a change to the states at the ends of the chain of states of the automaton).

Figure 7:
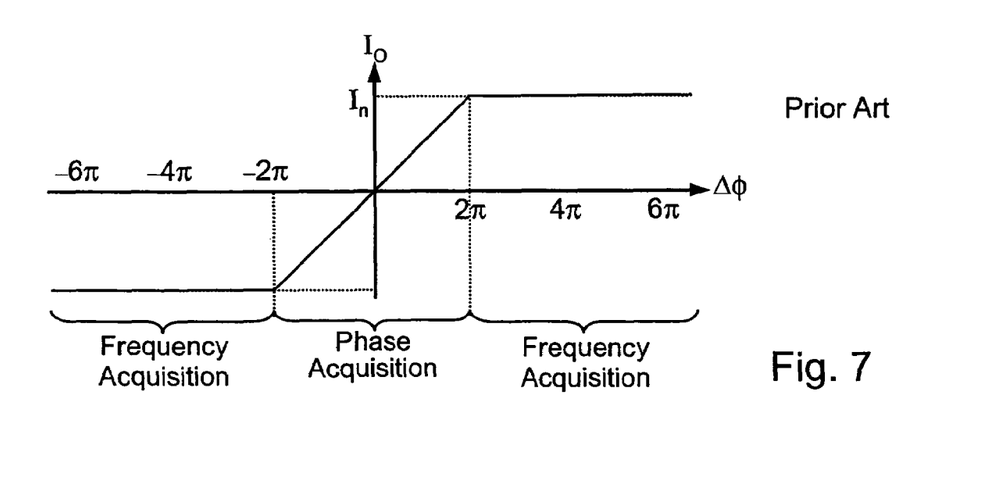
FIG. 7 depicts a transfer function of the FIG. 6 phase and frequency comparator, in the form of a curve of oscillator control current as a function of phase difference.

FIG. 7 depicts the transfer function of the above type of automaton. The transfer function also comprises three phase difference areas, namely a phase acquisition area, when the phase difference $\Delta\phi$ measured by the comparator 1 is from $-2\pi$ to $+2\pi$, the transfer function in this area being identical to that depicted in FIG. 3, and two frequency acquisition areas, when the phase difference is respectively less than $-2\pi$ and greater than $2\pi$. In the latter two areas the control current $I_o$ is constant and equal to $+I_n$ and $-I_n$, respectively. Compared to the comparator circuit with three states previously described, the comparator with five states has the advantage of an average control current during frequency acquisition phases whose absolute value is equal to $I_n$, i.e. to twice that of the comparator with three states. This substantially doubles the rate of frequency acquisition compared to the comparator with three states.

It is found that the above kind of comparator does not offer sufficient performance to satisfy the requirements specified in the new mobile telephone network standards.

Figure 8:
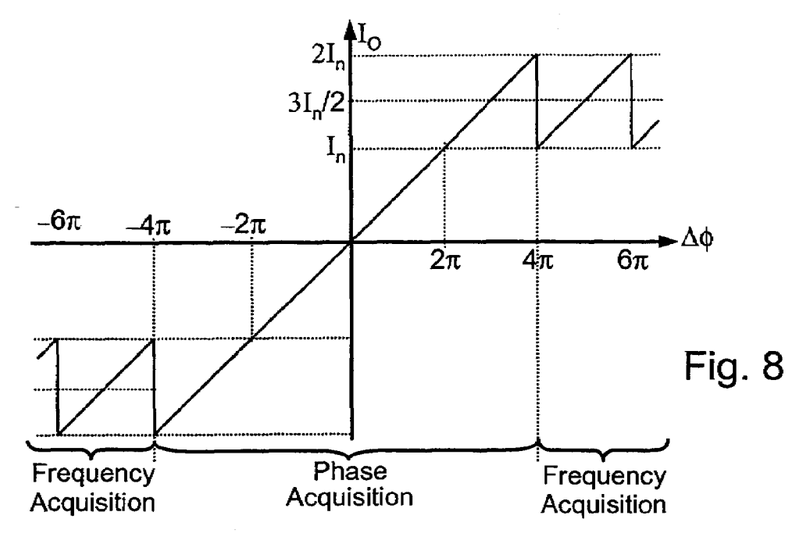
FIG. 8 depicts a transfer function of a phase and frequency comparator of the invention, in the form of a curve of the oscillator control current as a function of phase difference.

In order to respond to those new requirements, the present invention provides a phase and frequency comparator of the type described hereinabove in which the phase acquisition area is extended and the value of the average control current $I_o$ in the frequency acquisition areas is increased, as shown by the transfer function depicted in FIG. 8. In FIG. 8, the phase acquisition area (the area in which the control current $I_o$ is proportional to the phase difference $\Delta\phi$) corresponds to phase differences from $-4\pi$ to $+4\pi$ and the absolute value of the average control current $I_o$ in the frequency acquisition areas is equal to $3I_n/2$, i.e. it lies between $I_n$ and $2I_n$.

Figure 9:
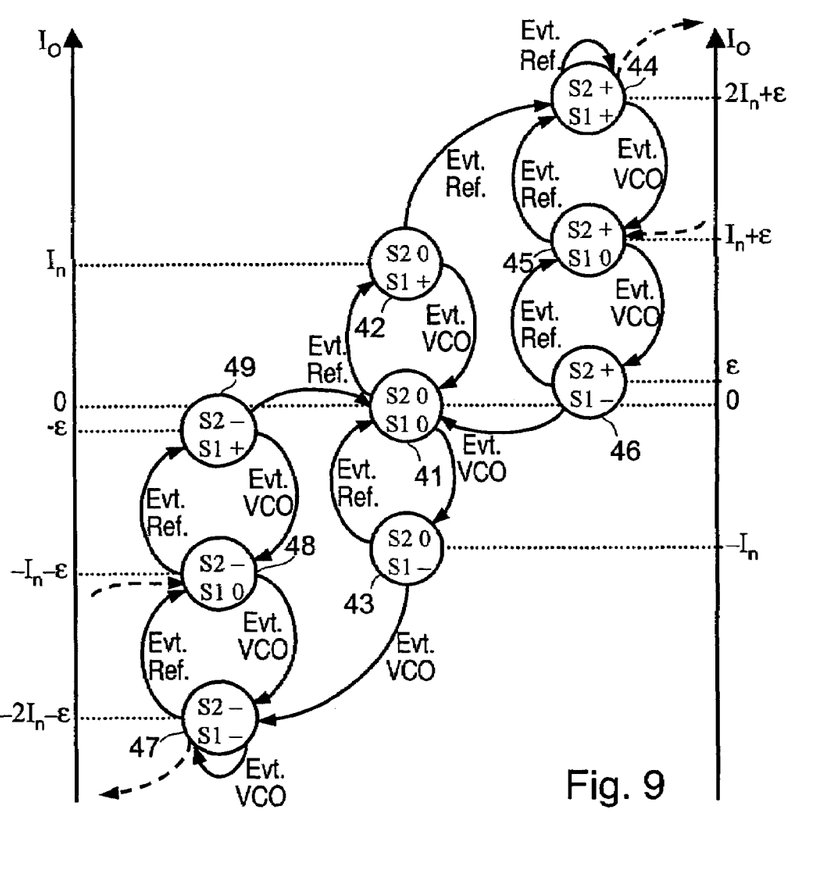
FIG. 9 depicts an automaton producing the FIG. 8 transfer function, in the form of a state and transition diagram.

The above objective is achieved with the aid of the automaton with nine states depicted in FIG. 9. The vertical axis in FIG. 9 represents the value of the control current $I_o$ obtained at the output of the comparator 1, the various states of the automaton being positioned on this axis as a function of the corresponding control current $I_o$ generated by the comparator.

Starting from an initial state 41, in which the automaton does not deliver a control current $I_o$, if an event occurs in a first of the input signals at the respective reference frequencies $F_{ref}$ and $F_{vco}/N$, the automaton goes to a state 42, respectively 43, in which the current is respectively equal to $I_n$ and $-I_n$. If, in the state 42 or 43, an event occurs in the second signal, the automaton returns to the initial state 41. On the other hand, if, in the state 42 or 43, an event occurs in the first signal, the automaton goes to the state 44, respectively 47, in which the current generated is equal to $2I_n+\epsilon$, respectively $-2I_n-\epsilon$, and remains in that state until an event occurs in the second signal. When an event occurs in the second signal, the automaton changes from the state 44, respectively 47, to the state 45, respectively 48, in which the control current is equal to $I_n+\epsilon$, respectively $-I_n-\epsilon$.

If, in the state 45 or 48, an event then occurs in the first signal, the automaton returns to the state 44, respectively 47. On the other hand, if an event occurs in the second signal, the automaton goes to the state 46, respectively 49, in which the control current $I_o$ is equal to $\epsilon$, respectively $-\epsilon$.

In the state 46, 49, the automaton returns to the state 45, respectively 48, if an event occurs in the first signal, and to the initial state 41 if an event occurs in the second signal.

Consequently, the state 44 or 47 is reached when two events in a first of the two input signals of the comparator are detected between two consecutive events in the second of the input signals.

It may be noted that this automaton, which comprises three series of three states, may be extended to an automaton with five series of three states (as indicated by the dashed line arrows), in which the additional two series of three states comprise states in which the control current $I_o$ is respectively equal to $3I_n+\epsilon+\epsilon_1$, $2I_n+\epsilon+\epsilon_1$ and $I_n+\epsilon+\epsilon_1$ for the first series and $3I_n+\epsilon+\epsilon_1$, $-2I_n+\epsilon+\epsilon+\epsilon_1$ and $-I_n+\epsilon+\epsilon_1$ for the second series.

The value of $\epsilon_1$ can advantageously be 0.

The automaton with 15 states can be generalized to obtain an automaton with $3(2n+1)$ states, where n is an integer greater than 2.

Figure 10:
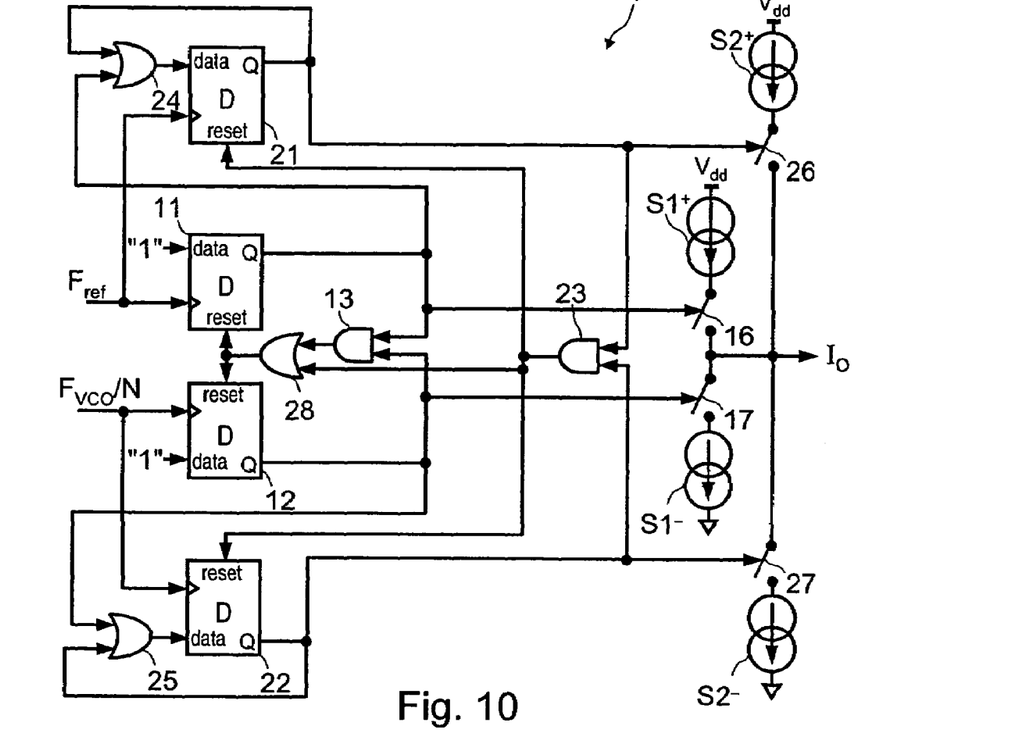
FIG. 10 is an electronic circuit diagram of a first embodiment of a phase and frequency comparator circuit of the invention.

The FIG. 9 automaton is based on the FIG. 10 circuit, for example, which is based on the FIG. 5 circuit, incorporating the same components interconnected in the same way. So, for a description of the components identified in FIG. 10 by the same reference numbers, see the description of FIG. 5.

In addition to the FIG. 5 circuit, the FIG. 1 0 circuit comprises another circuit substantially identical to the FIG. 5 circuit, i.e. two D-type bistable trigger circuits 21, 22 whose respective outputs Q control two switches 26, 27 which control the activation of two current sources $S2^+$ and $S2^-$ which are connected to the $V_{dd}$ power supply rail, to ground and to the $I_o$ output of the circuit in the same manner as the sources $S1^+$ and $S1^-$, to deliver at that output a current $I_n+\epsilon$, respectively $-I_n-\epsilon$.

The clock signal inputs of the bistable trigger circuits 21, 22 respectively receive the signal at the reference frequency and the signal at the frequency of the oscillator divided by N ($F_{vco}/N$). Moreover, the outputs Q of the two bistable trigger circuits 21, 22 are connected to respective inputs of an AND gate 23 whose output is connected to the reset inputs of the two bistable trigger circuits 21, 22.

Furthermore, the data inputs of the two bistable trigger circuits 21, 22 are connected to respective outputs of two OR gates 24, 25, the inputs of the OR gate 24 whose output is connected to the input of the bistable trigger circuit 21 being connected to respective outputs of the bistable trigger circuits 11 and 21 and the inputs of the OR gate 25 whose output is connected to the input of the bistable trigger circuit 22 being connected to respective outputs of the bistable trigger circuits 12 and 22.

Consequently, the bistable trigger circuit 21, 22 is unable to change to the high state until the bistable trigger circuit 11, 12 connected to the same input of the comparator has changed to the high state, and this high state of either of the bistable trigger circuits 21, 22 is maintained, independently of the state of the corresponding bistable trigger circuit 11, 12, until a signal in the high state is applied to the reset input of the bistable trigger circuit 21, 22.

The circuit further comprises another OR gate 28 between the output of the AND gate 13 and the reset inputs of the bistable trigger circuits 11, 12. The other input of the OR gate 28 is connected to the output of the AND gate 23. Thus resetting the bistable trigger circuits 21, 22 causes resetting of the bistable trigger circuits 11, 12.

As indicated in FIG. 9, in the state 41, all of the current sources are inactive (the switches 16, 17, 26 and 27 are open). In the state 42, respectively 43, only the source $S1^+$, respectively $S1^-$, is active. In the state 44, respectively 47, the sources $S1^+$ and $S2^+$, respectively $S1^-$ and $S2^-$, are active. In the state 45, respectively 48, only the source $S2^+$, respectively $S2^-$, is active. In the state 46, respectively 49, the sources $S2^+$ and $S1^-$, respectively $S2^-$ and $S1^+$, are active.

Provided that the reference signal and the signal from the frequency divider 4 have the same frequency (the phase difference $\Delta\phi$ measured by the comparator 1 is from $-2\pi$ to $+2\pi$), the operation of the circuit is identical to that described with reference to FIG. 5, i.e. the current sources $S2^-$ and $S2^+$ are never activated. The automaton therefore remains in the states 41 to 43.

On the other hand, as soon as two rising edges appear in a first of the two input signals of the comparator 1 between two consecutive rising edges of the second input signal, the output of the corresponding bistable trigger circuit 21 or 22 goes to 1, activating the current source $S2^-$ or $S2^+$ controlled by the bistable trigger circuit whose output goes to 1, the source $S1^-$, respectively $S1^+$, having been activated by the bistable trigger circuit 12, respectively 11, whose output changed to 1 on the first of the two rising edges. The phase difference $\Delta\phi$ is then greater than $+2\pi$ or less than $-2\pi$. The automaton is then in the state 44 or 47.

If a rising edge then appears in the second signal, the AND gate 13 resets the two bistable trigger circuits 11, 12, and this deactivates the current source $S1^-$, respectively $S1^+$ (states 45 or 48). Thus only the source $S2^-$, respectively $S2^+$, is active, and remains so for as long as there is no detection of two rising edges in the second signal between two consecutive rising edges in the first signal.

The result of all this is a linear area of the curve of the control current as a function of the phase difference from $-4\pi$ to $+4\pi$ (see FIG. 8).

If two rising edges occur in the second input signal between two consecutive rising edges in the first input signal, the corresponding bistable trigger circuit 11, 12 changes state, which activates the voltage source $S1^+$, $S1^-$, with the result that the sources $S2^+$ and $S1^-$ or $S2^-$ and $S1^+$ are active simultaneously (states 46 or 49). The control current $I_o$ is then equal to $\epsilon$ or $-\epsilon$.

To achieve the initial state 41 when one of the source $S2^-$ or $S2^+$ is active, the comparator 1 must receive, between two consecutive rising edges in the first signal, either two rising edges in the second signal (starting from the state 45 or 48) or three rising edges in the second signal (starting from the state 44 or 47).

When an event of this kind occurs, the bistable trigger circuit 21, 22 that was low goes high, which causes the output of the AND gate 23 to go high, and therefore triggers resetting of the bistable trigger circuits 21, 22. Because the output of the AND gate 23 is connected to the input of the OR gate 28, the bistable trigger circuits 11 and 12 are also reset.

It is in fact necessary to reset the bistable trigger circuits 11, 12 on resetting the bistable trigger circuits 21, 22 because the circuit would otherwise go directly to the state 43 or 42.

The current sources $S1^+$ and $S2^+$, respectively $S1^-$ and $S2^-$, are advantageously chosen to deliver slightly different currents (so that $\epsilon$ has a non-zero value), to prevent the automaton having three states in which the control current $I_o$ is close to zero, namely the states 41, 46 and 49. Furthermore, the current delivered by the sources $S2^-$ and $S2^+$ must be slightly higher than the current delivered by the sources $S1^-$ and $S1^+$ (so that $\epsilon$ has a positive value), to prevent a state in which the control current $I_o$ is zero when the phase difference $\Delta\phi$ is not zero, as shown in FIG. 11.

Figure 11:
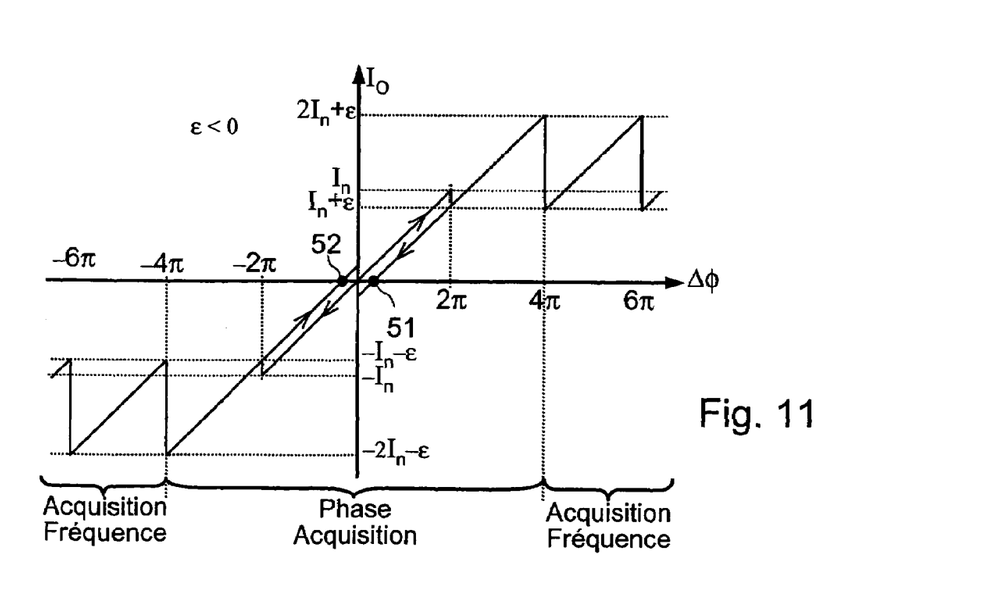
FIGS. 11 and 12 depict a transfer function of the FIG. 10 phase and frequency comparator, in the form of a curve of the oscillator control current as a function of phase difference.

In fact the FIG. 11 transfer function, which is obtained when the value of $\epsilon$ is negative, features two singular points 51 and 52 which are reached on moving toward the locking point ($\Delta\phi=0$, $I_o=0$), without the phase difference being zero, with two active current sources, namely $S1^-$ and $S2^+$ or $S2^-$ and $S1^+$. As a result of this, the oscillator 2 is locked with two active current sources that on average compensate each other. It is found that a state of this kind is to be avoided since each current source constitutes a source of noise which is applied to the control input of the oscillator. It is therefore preferable for all the current sources to be inactive when the oscillator is in the locked state.

Figure 12:
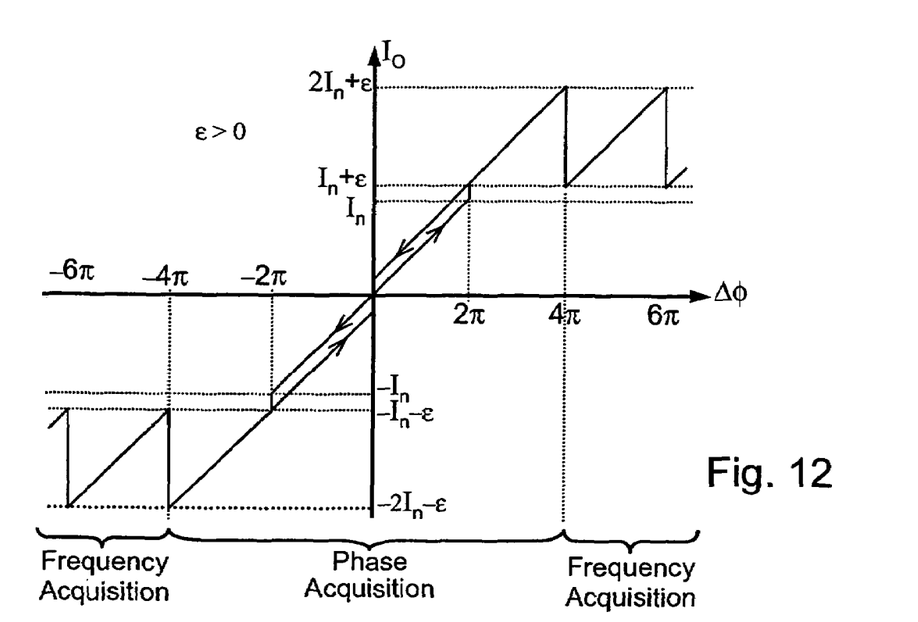

On the other hand, when the value of $\epsilon$ is positive, as shown in FIG. 12, the circuit never reaches a state in which the phase difference $\Delta\phi$ is non-zero when the control current $I_o$ is zero; on the contrary, it reaches states in which the phase difference $\Delta\phi$ is zero and the control current $I_o$ is non-zero. Furthermore, this increases the absolute value of the average control current during frequency acquisition phases, which is then equal to $I_n+\epsilon/2$ instead of $I_n$, this parameter having an important influence on the effectiveness of the comparator 1.

Figure 13:
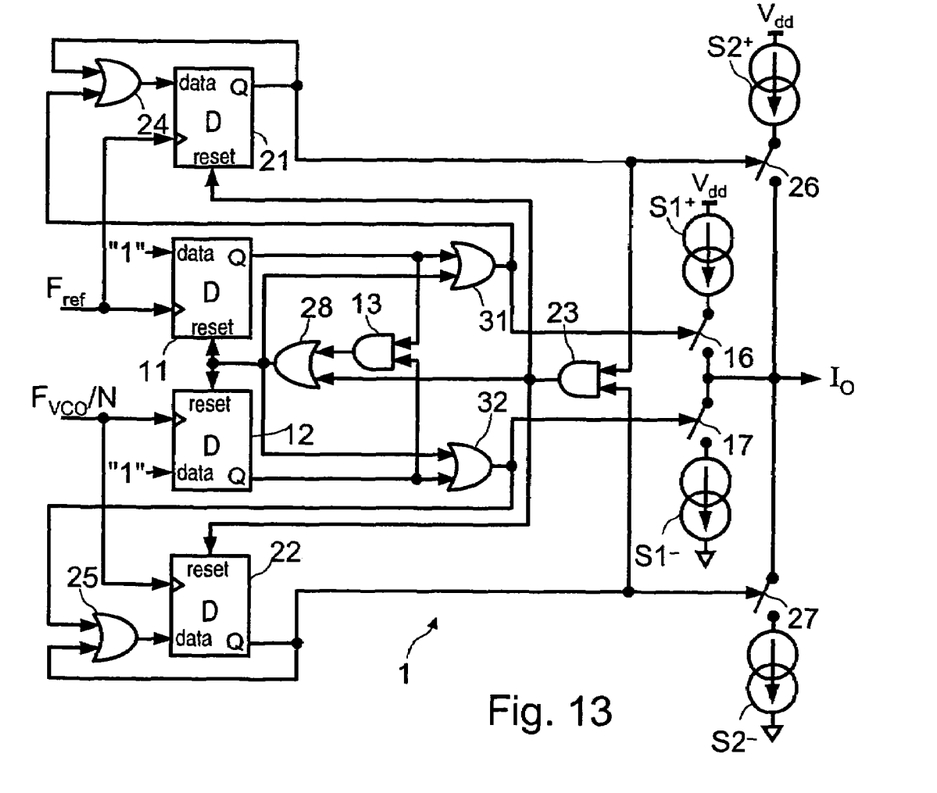
FIGS. 13 and 14 are electronic circuit diagrams of two other embodiments of a phase and frequency comparator circuit of the invention.

In a second embodiment of the invention, the FIG. 13 comparator 1 comprises two additional OR gates 31, 32 compared to the FIG. 10 comparator. The OR gate 31 is in the connection between the output Q of the bistable trigger circuit 11 and the junction between the control input of the switch 16 and the input of the OR gate 24, and therefore receives at its input the signal from the output Q of the bistable trigger circuit 11. The other input of the OR gate 31 is connected to the reset inputs of the bistable trigger circuits 11, 12.

Similarly, the OR gate 32 is in the connection between the output Q of the bistable trigger circuit 12 and the junction between the control input of the switch 17 and the input of the OR gate 25, and therefore receives at its input the signal from the output Q of the bistable trigger circuit 12. The other input of the OR gate 32 is connected to the reset inputs of the bistable trigger circuits 11, 12.

This prevents differences between the propagation times of the signals in the different portions of the circuit, by maintaining the respective data inputs of the bistable trigger circuits 21, 22 at 1 during resetting of the bistable trigger circuits 11, 12.

In particular, this avoids the critical situation in which a rising edge in a first input signal of the comparator occurs just before the second of two consecutive rising edges in the second input signal, the source S2⁻ or S2⁺ being on the point of being activated. As a rising edge in the first signal arrives before the rising edge activating the source S2⁻ or S2⁺, the source S1⁻, respectively S1⁺, being active, the two bistable trigger circuits 11, 12 are reset. The rising edge that occurs in the second signal during resetting of the two bistable trigger circuits 11, 12 is not detected. As a result of this, the corresponding current source S2⁻ or S2⁺ is not activated and the second signal is considered to be delayed relative to the first signal by 2π. This mode of operation corresponds to the prior art transfer function depicted in FIG. 3.

On the other hand, adding the OR gates 31, 32 maintains the respective data inputs of the gates 21 and 22 at 1, and these gates can then change state and activate the corresponding source S2⁻ or S2⁺ if a rising edge occurs during the resetting of the bistable trigger circuits 11, 12.

Furthermore, as the sources S1⁻ and S1⁺ are driven by the result of logically adding the output signal and the reset signal of the bistable trigger circuits 11, 12, this also guarantees complete activation of the sources S1⁻ and S1⁺.

Figure 14:
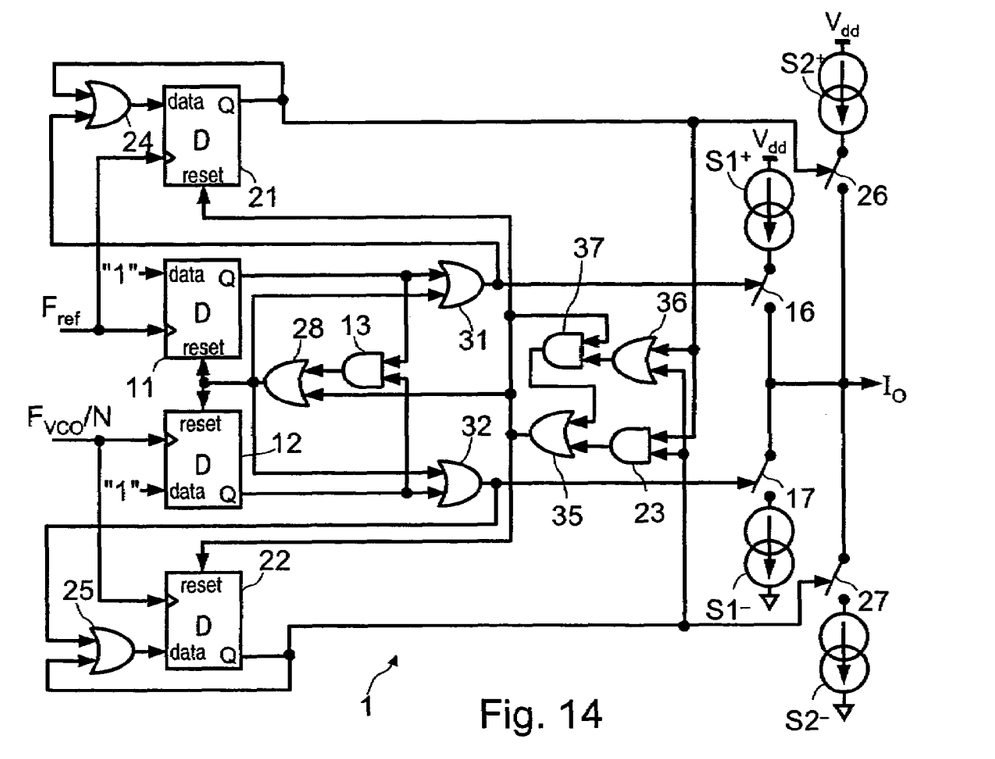

In a third embodiment of the invention, the FIG. 14 comparator 1 further comprises an additional two OR gates 35, 36 and an additional AND gate 37, compared to the FIG. 13 comparator.

The OR gate 36 is connected to the circuit in such a manner as to receive at its input the output signals of the bistable trigger circuits 21, 22. The output of the OR gate 36 is connected to an input of the AND gate 37 whose other input is connected to the reset input of the two bistable trigger circuits 21, 22. The OR gate 25 is between the output of the AND gate 23 and the reset line of the bistable trigger circuits 21, 22, the other input of the OR gate 35 being connected to the output of the AND gate 37.

This also prevents propagation time differences in the different portions of the circuit, which can arise in particular on deactivating the two sources S2⁻ and S2⁺.

In fact, if this feature is not implemented, the signal for resetting the bistable trigger circuits 21, 22 may go to 0 before one of the two sources S2⁻ and S2⁺ is deactivated. The three gates 35, 36, 37 maintain the reset signal in the active state until the two sources S2⁻ and S2⁺ are deactivated.

Of course, this feature can also be applied to the reset circuit of the bistable trigger circuits 11, 12.

As previously mentioned with reference to FIG. 9, the comparator depicted in FIGS. 10, 13 and 14, with two stages substantially identical to the FIG. 5 circuit, can be generalized to a comparator with $n$ stages in which the outputs of the bistable trigger circuits of stage $i$ can go to 1 only if the output of the bistable trigger circuit of the lower stage i-1 connected to the same input of the comparator has already gone to 1, and wherein resetting the bistable trigger circuits of the stage $i$ triggers resetting of the bistable trigger circuits of the lower stage i-1, where $i$ is an integer from 2 to $n$.

What is claimed is:

1. A method for controlling, as a function of frequency ($F_{ref}$) and phase of a reference signal ($S_{ref}$), the frequency ($F_{vco}$) and phase of an output signal of an oscillator having a frequency control input, said method comprising the steps of:

detecting continuously in the reference signal ($S_{ref}$) and in the signal from the oscillator events representative of the frequency and the phase of that signal, generating a first control signal at a first level ($I_n$) after detecting one of said events in a first signal of said reference signal and said signal from the oscillator, generating a second control signal at the first level and of opposite polarity to the first control signal after detecting one of said events in a second signal of said reference signal and said signal from the oscillator, applying the control signal ($I_o$; $V_o$) thus generated to the control input of the oscillator, and halting generation of the first and second control signals if they are generated simultaneously, which method is characterized in that it further comprises the steps of:

triggering the generation of a third control signal at a second level ($I_n+\epsilon$) after detecting one of said events in said first signal of said reference signal ($S_{ref}$) and said signal from the oscillator, if the first control signal is generated, triggering the generation of a fourth control signal at the second level and of the opposite polarity to the third control signal after detecting one of said events in said second signal of the reference signal and the signal from the oscillator, if the second control signal is generated, determining the control signal ($I_o$; $V_o$) to be applied to the control input of the oscillator by adding all of the control signals thus generated, and halting generation of all the control signals if the third and fourth control signals are generated simultaneously.

2. The method according to claim 1, characterized in that the frequency ($F_{vco}$) of the output signal of the oscillator is divided by a division ratio (N) and events in the signal from the oscillator are detected in the signal whose frequency ($F_{vco}$) has been divided by the division ratio (N).

3. The method according to claim 1, characterized in that the second control signal level ($I_n+\epsilon$) is identical to the first control signal level ($I_n$).

4. The method according to either claim 1 or claim 2, characterized in that the second control signal level ($I_n+\epsilon$) is slightly higher than the first control signal level ($I_n$).

5. The method according to claim 1, characterized in that it further comprises the steps of:

generating a $(2i-1)^{th}$ control signal at an $i^{th}$ level after detecting one of said events in the first signal of said reference signal and said signal from the oscillator while the $(2i-3)^{th}$ control signal is generated, where $i$ is an integer greater than 2, generating a $(2i)^{th}$ control signal at the $i^{th}$ level and of the opposite polarity to the $(2i-1)^{th}$ control signal after detecting one of said events in the first signal of said reference signal and said signal from the oscillator while the $(2i-2)^{th}$ control signal is generated, and halting the generation of the $(2i)^{th}$, $(2i-1)^{th}$, $(2i-2)^{th}$ and $(2i-3)^{th}$ control signals if the $(2i)^{th}$, $(2i-1)^{th}$ control signals are generated simultaneously.

6. The method according to claim 5, characterized in that the $i^{th}$ control signal level is identical to the $(I-1)^{th}$ control signal level.

7. A phase and frequency comparator adapted to control the frequency of the output signal of an oscillator having a frequency control input, the comparator receiving at its input a signal ($S_{ref}$) having a reference frequency ($F_{ref}$) and a signal from the oscillator and comprising:
   first detection means for detecting continuously in the reference signal ($S_{ref}$) and in the signal from the oscillator events representative of the frequency and the phase of the signal,
   a first source ($S1^+$) of control signals at a first level ($I_n$),
   a second source ($S1^-$) of control signals at the first level ($I_n$) and of the opposite polarity to the signal from the first source,
   first switching means which when closed apply to the output of the comparator the control signal from the first source ($S1^+$) after detection of one of said events in a first signal of said reference signal and said signal from the oscillator,
   second switching means which when closed apply to the output of the comparator the signal from the second source ($S1^-$) after detection of one of said events in a second signal of said reference signal and said signal from the oscillator, and
   first control means for controlling the first and second switching means to place them in the open state when they are simultaneously in the closed state, which phase comparator is characterized in that it further comprises:
   a third source ($S2^+$) of control signals at a second level ($I_n+\epsilon$),
   a fourth source ($S2^-$) of control signals at the second level ($I_n+\epsilon$) and of the opposite polarity to the signal from the third source,
   third switching means which, in the closed state when the first switching means are in the closed state, apply to the output of the comparator the control signal from the third source ($S2^+$) after detection of one of said events in the first signal of said reference signal and said signal from the oscillator,
   fourth switching means which, in the closed state when the second switching means are in the closed state, apply to the output of the comparator the signal from the fourth source ($S2^-$) after detection of one of said events in the second signal said reference signal and said signal from the oscillator, the output signal ($I_o$) of the comparator having a level corresponding to the sum of the control signals applied by the switching means at the output of the comparator, and
   second control means adapted to place the first and second switching means the open state when the third and fourth switching means are simultaneously in the closed state.

8. The phase and frequency comparator according to claim 7, characterized in that the first and second control signal levels ($I_n$, ($I_n+\epsilon$)) are constant.

9. The phase and frequency comparator according to claim 7, characterized in that the second control signal level is slightly higher than the first control signal level.

10. The phase and frequency comparator according to claim 7, characterized in that the signal from the oscillator applied at the input of the comparator is obtained by dividing the frequency ($F_{vco}$) of the output signal of the oscillator by a division ratio (N).

11. The phase and frequency comparator according to claim 7, characterized in that it further comprises second detector means for continuously detecting in the reference signal ($S_{ref}$) and in the signal from the oscillator events representative of the frequency and the phase of that signal and means for activating the second detection means only if the first or the second switching means are in the closed state and for maintaining the second detection means in the closed state independently of the state of the first detection means.

12. The phase and frequency comparator according to claim 11, characterized in that it further comprises means for maintaining the second detection means active during the change to the open state of the first and second switching means.

13. The phase and frequency comparator according to claim 7, characterized in that it further comprises means for maintaining the first control means and the second control means in the active state until the first switching means and the second switching means and/or the third switching means and the fourth switching means have changed to the open state after triggering of the control means.

14. The phase and frequency comparator according to claim 7, characterized in that it further comprises:
   a $(2i-1)^{th}$ source of control signals at an $i^{th}$ level,
   a $(2i)^{th}$ source of control signals at the $i^{th}$ level and of the opposite polarity signal from the $(2i-1)^{th}$ source,
   $(2i-1)^{th}$ switching means which, in the closed state when the $(2i-3)^{th}$ switching means are in the closed state, apply to the output of the comparator the control signal from the $(2i-1)^{th}$ source after detection of one of said events in the first signal of said reference signal and said signal from the oscillator,
   $(2i)^{th}$ switching means which, in the closed state when the $(2i-2)^{th}$ switching means are in the closed state, apply to the output of the comparator the signal from the $(2i)^{th}$ source, after detection of one of said events in the second signal of said reference signal and said signal from the oscillator, the output signal ($I_o$) of the comparator having a level corresponding to the sum of the control signals applied by the switching means at the output of the comparator, and
   means for controlling the $(2i-3)^{th}$ to $(2i)^{th}$ switching means to place them in the open state when the $(2i-1)^{th}$ and $(2i)^{th}$ switching means are simultaneously in the closed state.

* * * * *